United States Patent

Ditlow et al.

(10) Patent No.: US 6,601,025 B1
(45) Date of Patent: Jul. 29, 2003

(54) METHOD TO PARTITION THE PHYSICAL DESIGN OF AN INTEGRATED CIRCUIT FOR ELECTRICAL SIMULATION

(75) Inventors: Gary S. Ditlow, Garrison, NY (US); Daria R. Dooling, Huntington, VT (US); Richard L. Moore, Colchester, VT (US); David E. Moran, South Burlington, VT (US); Thomas W. Wilkins, Shelburne, VT (US); Ralph J. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/371,202

(22) Filed: Aug. 10, 1999

(51) Int. Cl.[7] ................................. G06F 17/50
(52) U.S. Cl. ......................... 703/14; 703/18; 703/22; 716/4; 716/7
(58) Field of Search ............... 703/1–5, 13–22; 716/1–12

(56) References Cited

U.S. PATENT DOCUMENTS

| | | | |
|---|---|---|---|
| 5,132,195 A | 7/1992 | Pool | 430/22 |
| 5,260,151 A | 11/1993 | Berger et al. | 430/5 |
| 5,313,398 A | 5/1994 | Rohrer et al. | 703/14 |
| 5,369,594 A | 11/1994 | Huang et al. | 716/7 |
| 5,663,017 A | 9/1997 | Schinella et al. | 430/5 |
| 5,675,522 A | 10/1997 | Akiyama | 716/20 |
| 5,706,477 A | 1/1998 | Goto | 703/14 |
| 5,789,807 A | 8/1998 | Correale, Jr. | 257/691 |
| 5,837,557 A | 11/1998 | Fulford, Jr. et al. | 438/6 |
| 5,841,967 A | 11/1998 | Sample et al. | 714/33 |
| 6,064,808 A | * 5/2000 | Kapur et al. | 703/1 |
| 6,086,238 A | * 7/2000 | Mehrotra et al. | 716/10 |
| 6,128,768 A | * 10/2000 | Ho | 716/11 |
| 6,144,932 A | * 11/2000 | Hachiya | 703/14 |
| 6,237,126 B1 | * 5/2001 | Bonitz | 703/13 |

OTHER PUBLICATIONS

Jiang et al, "Fast Extraction of the Capacitance Matrix of Multilayered Multiconductor Interconnects Using the Method of Lines" 1997 IEEE Multi–Chip Module Conference, pp. 98–101 (Feb. 1997).*

* cited by examiner

Primary Examiner—Samuel Broda
(74) Attorney, Agent, or Firm—McGinn & Gibb, PLLC; Richard M. Kotulak, Esq.

(57) ABSTRACT

A method is provided for designing an integrated circuit that includes receiving a graphical description of the integrated circuit, extracting shapes relating to a specific circuit function from the graphical description of the integrated circuit, and partitioning the extracted shapes into a plurality of segments. The method may form an electrical representation of the integrated circuit for each of the plurality of segments and solve a matrix equation (Gv=i) for each of the plurality of segments based on the electrical representation.

29 Claims, 6 Drawing Sheets

METHOD TO PARTITION THE PHYSICAL DESIGN OF AN INTEGRATED CIRCUIT FOR ELECTRICAL SIMULATION

BACKGROUND OF THE INVENTION

1. Field of the Invention

The present invention generally relates to an improved method and apparatus for computer-aided integrated circuit (IC) design automation, and more specifically to IC physical design (PD) and electrical simulation. In particular, the present invention provides a method and apparatus to partition the physical design of an IC so as to divide the host computer resource demand of file space, memory and computation needed for IC electrical simulation.

2. Description of the Related Art

Conventional ICs use three signal "types", namely, power signals, clock signals, and data/control signals. These signals arrive at the IC signal interface from external sources— the power supply, clock, memory/file and external ICs. Signals are then distributed by their respective "grids" to their semiconductor transistors where the arithmetic/logic functions are performed; and then are returned to the IC signal interface by the appropriate signal grid.

Signal voltages are "voltage divided" from their initial "high" potential at the IC signal interface to a lower potential at the IC transistors. These signals may then again be divided in potential from that at the IC transistors to a final low potential at the IC signal interface.

These three grids are realized by the IC fabrication process as a series of conductive "mesh" levels and interconnecting "via" levels that are physically superimposed within the IC but electrically insulated. The metalization process creates a three-dimensional structure where the mesh levels are a laminate of x-y (i.e., horizontal) planes, stacked in the z (i.e., vertical) plane and connected by the via levels. A contemporary microprocessor IC may have six to eight mesh levels and as many via levels.

Figure 1:
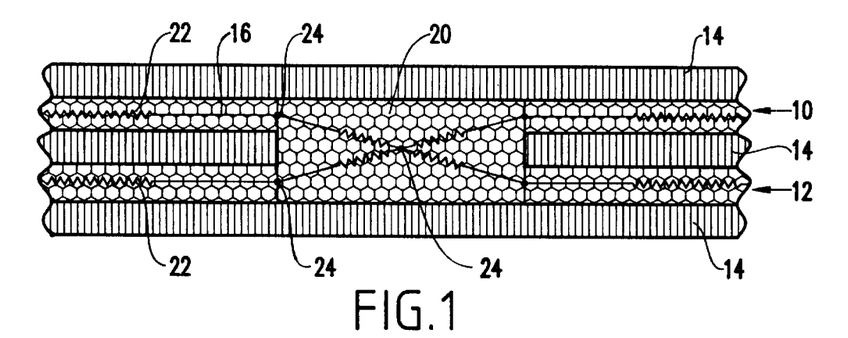
FIG. 1 shows a side view of an IC physical design with two mesh levels and an interconnecting via level.

For example, FIG. 1 shows a first mesh level 10 and a second mesh level 12. Aluminum or aluminum/copper alloy conductors may form the mesh levels 10, 12 and the via 20. The mesh levels 10, 12 and the via 20 are embedded in an insulator such as silicon dioxide 14. The via metalization is preferably formed by etching an opening in the silicon oxide 14, filling the hole with metal such as aluminum and then depositing the next mesh level over the via 20.

The signal grids may be described by a physical design (PD) database. The physical design database is a graphics description of the integrated circuit and includes graphic "shapes" such as rectangles and polygons with physical dimensions and geometries that are defined by the technology groundrules of the IC fabrication process. Shapes can be of two forms: "real" shapes that are translated into the fabrication process to direct the IC fabrication process, or "attribute" shapes that describe the IC physical design but are unnecessary for the fabrication process. In other words, the graphics description represents the three-dimensional integrated circuit and includes all information necessary to build an IC.

In addition to representing the physical design of an IC, the physical design database can also be used to formulate an electrical network model of the IC. For example, FIG. 1 also shows electrical resistors 22 associated with the mesh levels 10, 12 and the via 20. The connection points of the resistors 22 are commonly referred to as nodes 24. The nodes 24 correspond to the physical shapes that comprise the mesh levels 10, 12 and the via 20 of the signal grids. Accordingly, the three-dimensional physical location of the nodes 24 is known based on the graphics description. The nodes 24 are the points at which the node voltages are determined by electrical simulation.

The process of translating the graphics description of the integrated circuit into an electrical simulation consists of isolating shapes of interest from the complete IC physical design. This is referred to as shapes extraction. So, for example, if the electrical simulation involves the IC power grid, then the shapes of the power grid are extracted from the total physical design IC. Then, using well known software programs such as SPICE and ASTAP, the physical shapes of the items of interest are converted into electrical components such as resistors, capacitors, inductors and transistors. For example, a rectangular shape that appears in a signal mesh may be translated into a resistor, with its nodes associated with the ends of the rectangle. From this shapes extraction, a netlist is produced that describes the circuit of interest using an interconnected set of electrical components. As is well known, a netlist is a description of element values (such as resistors, capacitors, inductors, current sources and voltage sources) and their interconnected relationship. An example of a netlist may be:

$Res1, A-B=7.2$ $Res2, B-C=2.1$ $J1, C-A=1.6.$

A contemporary microprocessor (or workstation) may have on the order of 50 million resistors in its power grid thereby leaving an extremely lengthy and sometimes impossible computation task.

Subsequently, a workstation applies an electrical simulation to the netlist.

As is known in the art, this involves the generation and solution of the matrix equation $$Gv=i \qquad (1)$$

where the nodes of G correspond to values and interconnections of the netlist. Matrix equation (1) is derived from Ohm's Law, namely V=iR.

A contemporary microprocessor (or workstation) can have on the order of 20 million nodes for its power grid, thereby leaving a rather lengthy and sometimes impossible computation task to solve the matrix equation (1).

Furthermore, integrated circuits (ICs) continue to increase in functionality and physical complexity. This significantly increases the design automation (DA) of the ICs. That is, the amount of data that needs to be computed is too large to be handled by one workstation. This requires more host computer resource than is available by conventional workstations. For example, a typical power signal for today's IC is described by three gigabytes of netlist description and cannot be solved by conventional "uni" processing. As explained in greater detail below, this problem has been solved in 30 minutes using the inventive approach.

SUMMARY OF THE INVENTION

In view of the foregoing and other problems of the conventional methods, it is, therefore, an object of the present invention to provide a method of designing an integrated circuit. The method may include receiving a graphical description of the integrated circuit, extracting shapes relating to a specific circuit function (such as power) from the graphical description of the integrated circuit and partitioning the extracted shapes into a plurality of segments. The method may further include forming an electrical representation of the integrated circuit for each of the plurality of segments and solving a matrix equation of $Gv=i$, where G relates to resistance, i relates to current and v relates to voltage, for each of the plurality of segments based on that electrical representation.

Partitioning the extracted shapes may include locating seams within the extracted shapes where each seam crosses a mesh line defined by the extracted shapes of the integrated circuit. The partitioning may also include creating stitches within the extracted shapes and identifying stitch nodes at areas where seams cross mesh lines. To solve the matrix equation, the method may include determining a voltage at each stitch node.

The electrical representation may further include a plurality of resistors that connect at each stitch node. The matrix equation may be solved by forming a matrix representation of each segment based on the electrical representation for that respective segment and determining a voltage at each stitch node for each respective segment.

The method may further include exchanging the determined stitch node voltages between adjacent segments, computing a new current for each segment, determining a new voltage at each stitch node for each respective segment using the new current and determining whether the new voltage at each stitch node is within a predetermined tolerance.

The matrix equation may be solved to determine a voltage at specific locations of the integrated circuit. The method may further include exchanging voltages between adjacent segments and performing an iterative process until the respective voltages are within a predetermined tolerance.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

The present invention teaches a method and apparatus to partition the physical design of an integrated circuit so as to divide the host computer resource demand of file space, memory and computation (CPU) needed for the IC electrical simulation. This partitioning is preferably accomplished using stitches and seams, which are determined from the graphics description of the integrated circuit. By partitioning the physical design of the IC, a plurality of workstations can accurately solve the matrix equation (1) using a reiterative process.

As discussed above, FIG. 1 shows a side-view of an IC physical design having two mesh levels 10, 12 and an interconnecting via 20. Resistors 22 are superimposed on these shapes that result from electrical extraction of the graphics description. The preferred method only extracts the shapes of interest, such as the power grid, from the graphics description. As discussed above, this is commonly called shapes extraction.

Figure 2:
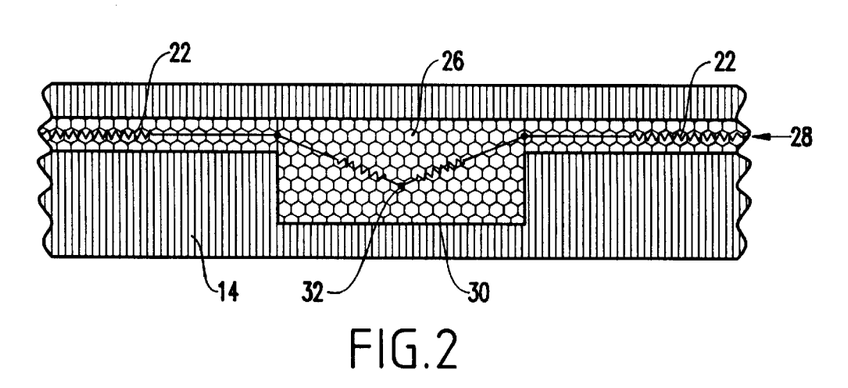
FIG. 2 shows a side view of an IC physical design with one mesh level and a stitch level.

The graphics description is then partitioned. The present invention may utilize a novel apparatus that will be referred to as a stitch. The stitch may be represented in the graphics description of the integrated circuit as a floating via, which is a via in an upper mesh level that does not contact a lower mesh level. FIG. 2 illustrates a side-view of an IC physical design showing a mesh level 28 and a stitch 30. A stitch is a visual/graphic location of an interconnect. Like FIG. 1, resistors 22 are superimposed on these shapes that result from electrical extraction of the graphics description. The presence of the stitch 30 is detected by the electrical extractor, which generates the electrical network. The electrical node 32 located at the center of the stitch 30 will be referred to as a stitch node.

Figure 3:
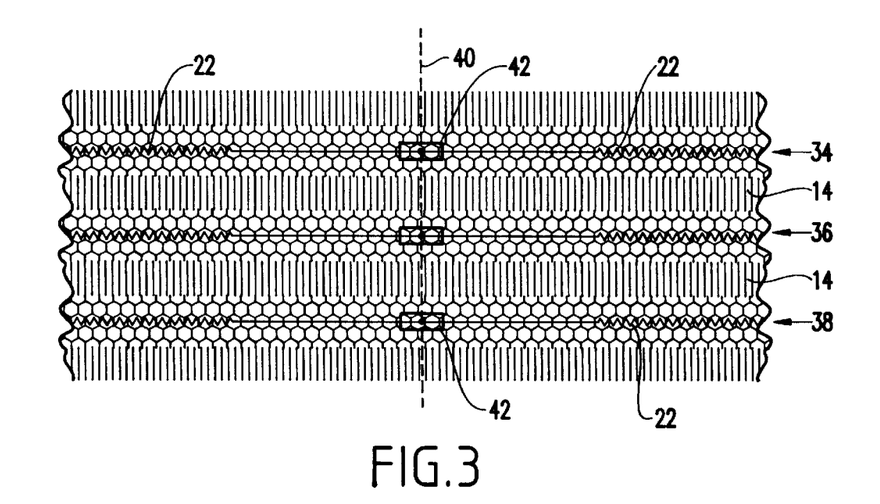
FIG. 3 shows a top view of an IC physical design with several mesh levels.
Figure 4:
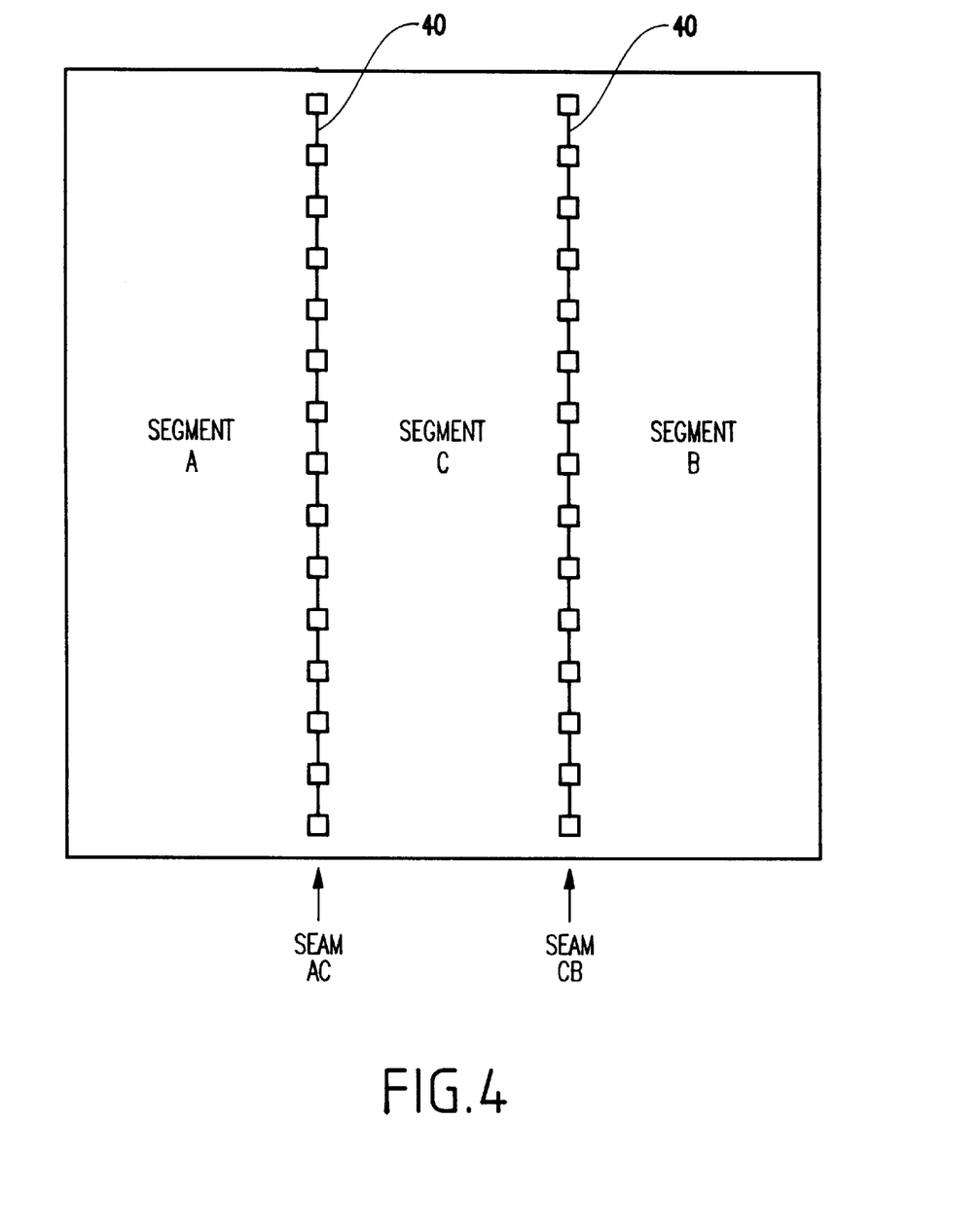
FIG. 4 shows the IC partitioned into three segments.

The present invention may also utilize a novel apparatus that will be referred to as a seam. A seam may be represented in the graphics description of the IC as a set of stitches that partition the IC into two of more segments. FIG. 3 illustrates a top-view of an IC physical design showing several mesh lines 34, 36 and 38. Resistors 22 are superimposed on these shapes that result from electrical extraction. The seam 40 is also shown as extending across the IC and across stitch nodes (also hereafter called seam nodes 42). Although FIG. 3 shows the seam 40 as being straight, the present invention need not have a straight seam. Further, the detection of the seam may be done automatically. The intersection of the "cut" shape with each metal layer results in the corresponding lower level "via". A seam is a group of stitches that separates segments (or sections), as shown in FIG. 4.

The present invention may also utilize a partitioning method, which is a division of the IC into two or more segments (or sectors). FIG. 4 illustrates the IC partitioned into three segments (or sectors) ACB, for example. Ideally this represents the entire integrated circuit. However, the present invention is not limited to partitioning an IC into three segments. Rather, the IC may be partitioned into any reasonable number of segments. This partitioning is accomplished by two seams: seam AC located between segment A and segment C, and seam CB located between segment C and segment B. The seam 40 or boundary between the segments is an imaginary line drawn through the stitch nodes 42. Then, subsequent to locating seams and creating stitches, the workstation determines the shapes and thus the electrical representations (or equivalents) of circuit elements for each segment. This results in a netlist for each of the respective segments (i.e., Netlist A, Netlist B and Netlist C).

Unlike the prior art, the present invention also utilizes a novel method (herein referred to as a relaxation method) that allows the electrical simulation, or solution of the matrix equation $Gv=i$, to be distributed to several workstations and performed in parallel. This is a task parallel solution in which each processor (or workstation) separately solves the matrix equation (1) for each of their respective netlists. This significantly decreases the amount of time needed to compute the data and solve the matrix equation. For example, using this described method, the computation has been reduced to approximately 1 hour and ten minutes.

Figure 5:
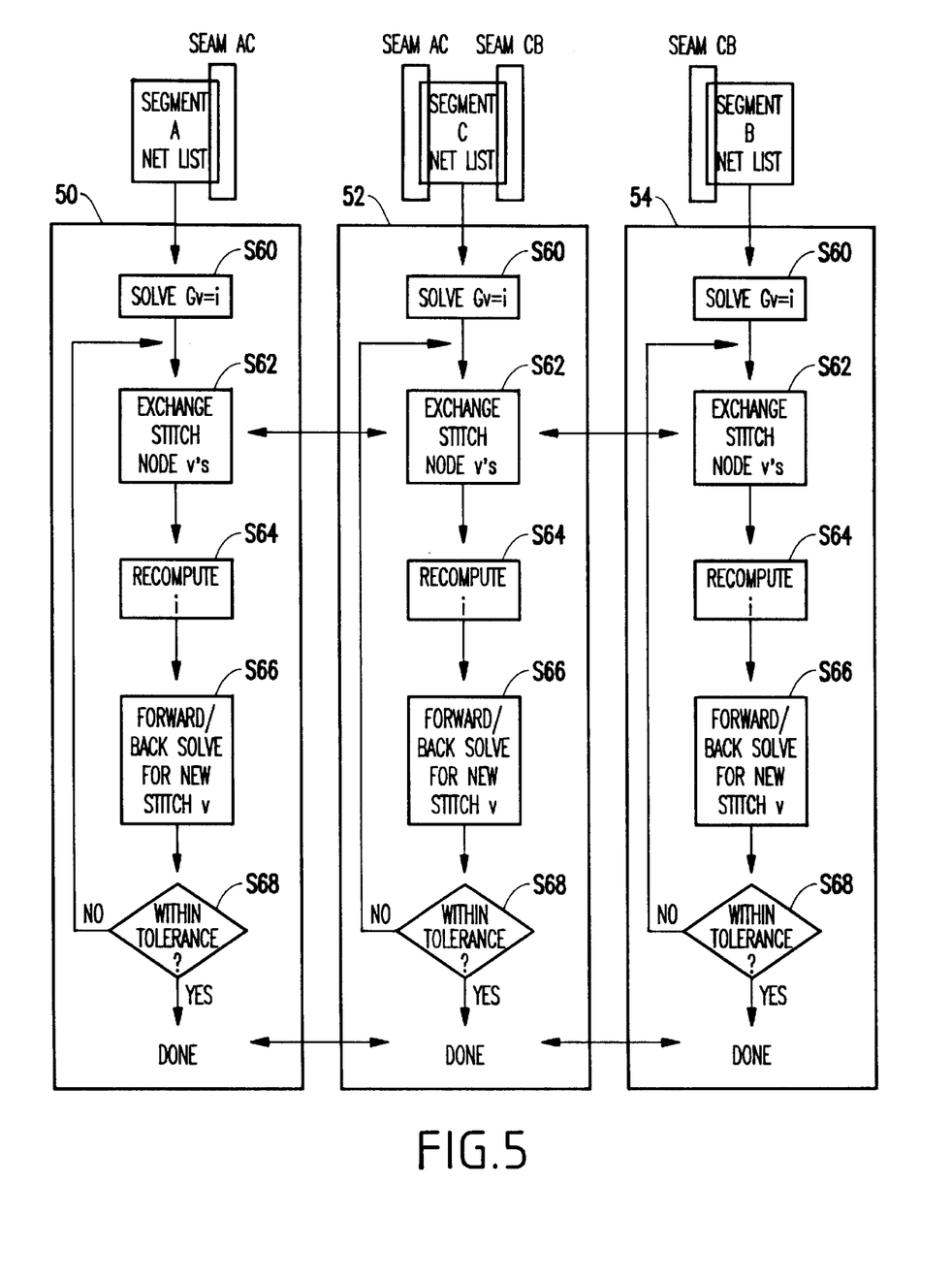
FIG. 5 shows a method where segments of the IC are solved in parallel and stitch node voltages are exchanged between processors.

The present invention preferably assigns each of the segments (or sectors) to a separate workstation in order to properly solve the matrix equation Gv=i for that specific segment. That is, the matrix equation (1) associated with each of the N segments represented in FIG. 4 is assigned to a separate one of the N workstations, namely processor 50, processor 52 and processor 54 as shown in FIG. 5. Each processor (or workstation) 50, 52 and 54 separately solves its matrix equation (1) to arrive at the node voltage(s) v. This is preferably performed in parallel (i.e., task parallel) in steps S60. By independently solving the matrix equations for the sectors, any current entering or exiting a sector at the stitch nodes must be negotiated between adjacent processors. The stitch node voltages (i.e., the solutions) which were determined in step S60 are then exchanged between adjacent workstations in steps S62. For example, the stitch node voltages of processor 50 are exchanged with the stitch node voltages of processor 52 and the stitch node voltages of processor 52 are exchanged with the stitch node voltages of processor 54. This is called a data parallel solution.

After the exchange of the stitch node voltages in step S62, new electrical currents are computed in steps S64 based on the delta voltage for the stitch nodes, and the matrix equation is re-solved for the new node voltages in step S66. Then, in step S68, each processor 50, 52 and 54 determines whether the respective node voltages v are within a certain tolerance. If so, then the physical design of the IC has been determined. That is, the matrix equation has been solved for the node voltages v. Accordingly, the correct voltage at each node will be known. If not, then steps S62, S64, S66 and S68 are repeated or reiterated until the appropriate tolerance is determined in step S68, and i is recomputed based on equation 2 as discussed below.

More specifically, solving Gv=i involves factoring matrix G into $LL^T$, where L is a lower triangular factor of G and $L^T$ is an upper triangular factor of G such that $L \times L^T = G$. Solving the triangular system Ly=i for y is referred to as forward solving. Next the triangular system $L^T v=y$ is solved for v, the node voltages. Solving $L^T v=y$ is referred to as back solving.

Figure 6:
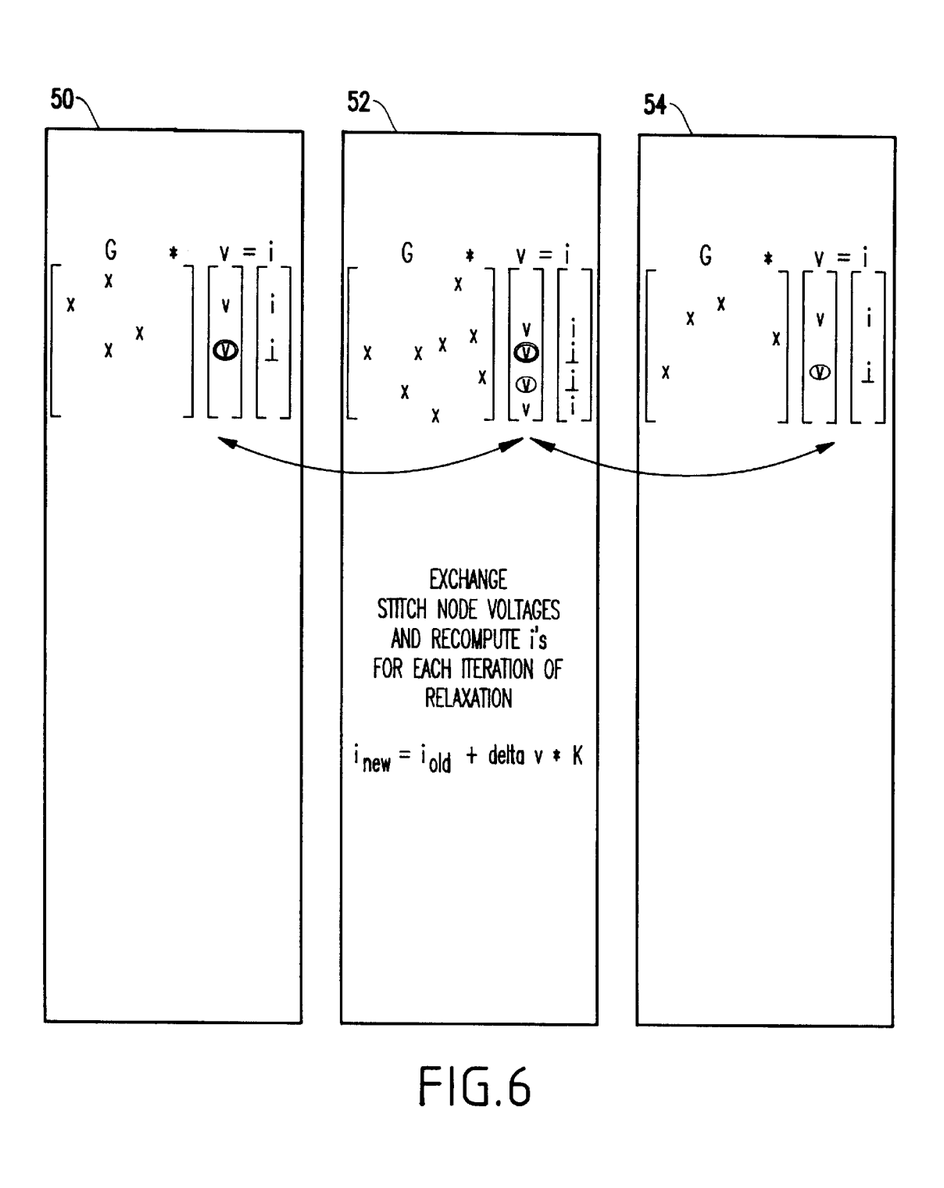
FIG. 6 shows a mathematical representation of the IC in each processor.

Stated differently, electrical extraction after partitioning the IC produces a netlist that represents each segment of the IC. In the example described above with respect to FIGS. 3–5, the IC is divided into three segments A, B, and C. Three workstations, or processors 50, 52 and 54, will preferably be used to solve the matrix equation (1) cooperatively. As is known in the art, a workstation with multiple processors may solve multiple segments. Once each processor reads the respective input netlist, the processor solves the matrix equation Gv=i in step S60. The solved stitch node voltages are then exchanged with its neighboring processor(s) in step S62. For illustration purposes, FIG. 6 shows simple matrix equations where adjacent processors exchange the circled stitch node voltages. Since the stitch nodes are replicated in each adjacent independent segment, the voltages computed for stitch nodes may also be different in each segment. Only stitch node voltages need to be exchanged in order to determine and reduce any error in the computed stitch voltage incurred by the partitioning of the IC.

Electrical currents are updated by the following equation 2 in step S64 where there are stitch nodes. These currents are underlined in FIG. 6:

$$i_{new} = i_{old} + \Delta v * K, \qquad (2)$$

where $i_{old}$ is the current from the prior iteration, $\Delta v$ is the difference in stitch node voltages along the seam between processors, and K is a convergence factor.

The matrix equation is then re-solved in step S66 and the node voltage deltas between this iteration and the last one are compared to a tolerance in step S68. When the node voltage deltas are within a tolerance, the seams between the segments have been "smoothed" (i.e., the error induced by the seam has been minimized) and all the node voltage solutions (i.e., one per processor) may be visualized together to produce a complete picture of voltage drops for the entire IC.

This method allows an IC to be divided (or partitioned) into a number of segments and solved in separate workstations. Thus, a complex matrix equation may be solved in a quicker amount of time. This divides the resource demand of file space, memory and computation (CPU) needed for the IC electrical stimulation.

Figure 7:
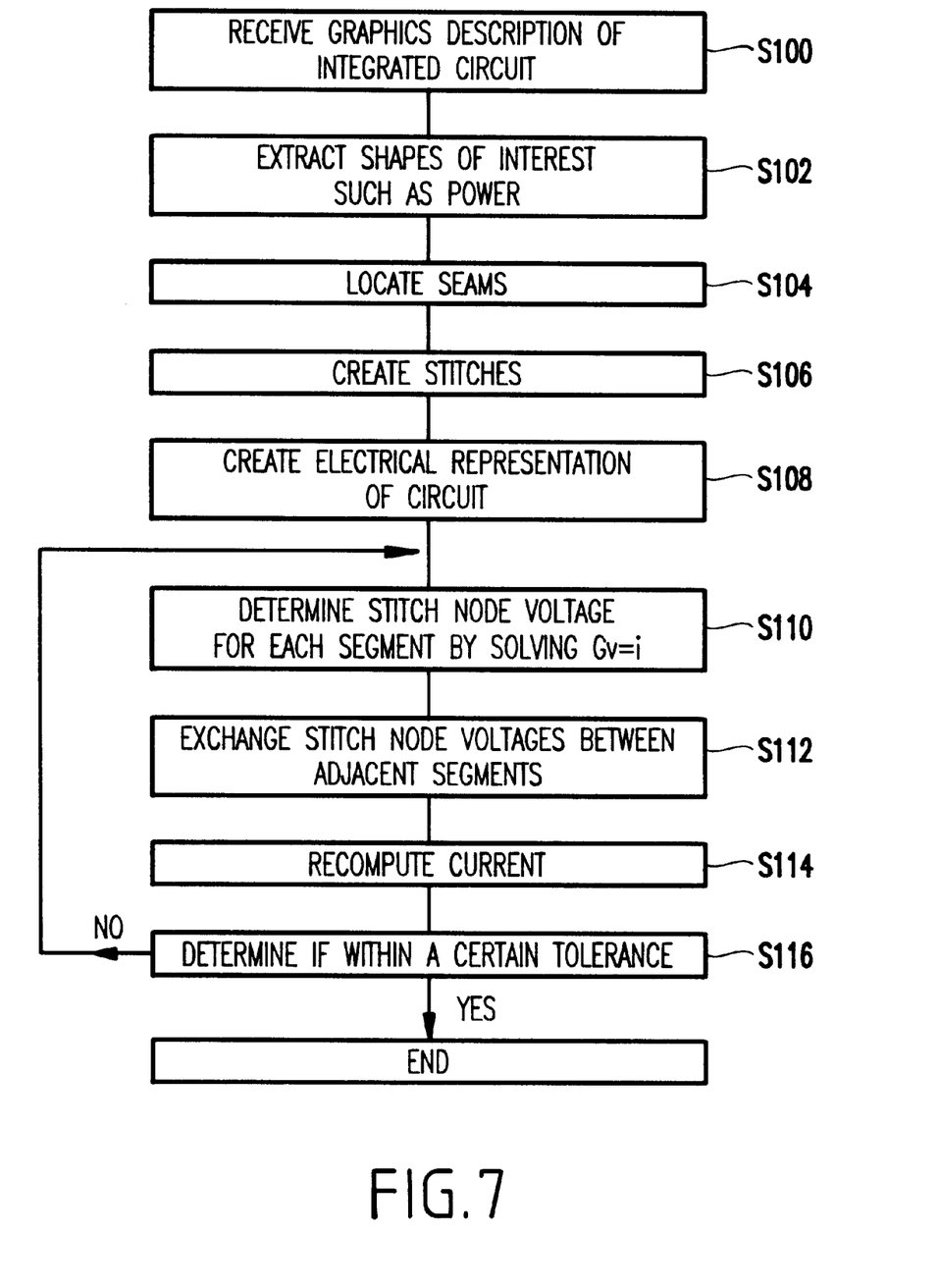
FIG. 7 shows a flowchart of a preferred method according to the present application.

FIG. 7 shows a flowchart of the overall operation of the present invention. In step S100, the graphics description of the IC is received. Then, in step S102, shapes of interest (such as power) are extracted. Subsequently, in step S104, seams are automatically located and stitches are then automatically created in step S106. An electrical representation of the circuit is then created in step S108 preferably using conventional software.

In step S110, the stitch node voltage is determined for each segment (preferably using separate processors) by solving the matrix equation Gv=i. Stitch node voltages are then exchanged between adjacent segments in step S112. Then, the current is recomputed in step S114 using the exchanged stitch node voltages. In step S116, the processors determine whether the current is within a certain tolerance. If the answer is yes, then the operation is ended as the matrix equations have been solved. If the answer is no, then steps S110 through S116 are repeated until the voltage is within the certain tolerance.

Figure 8:
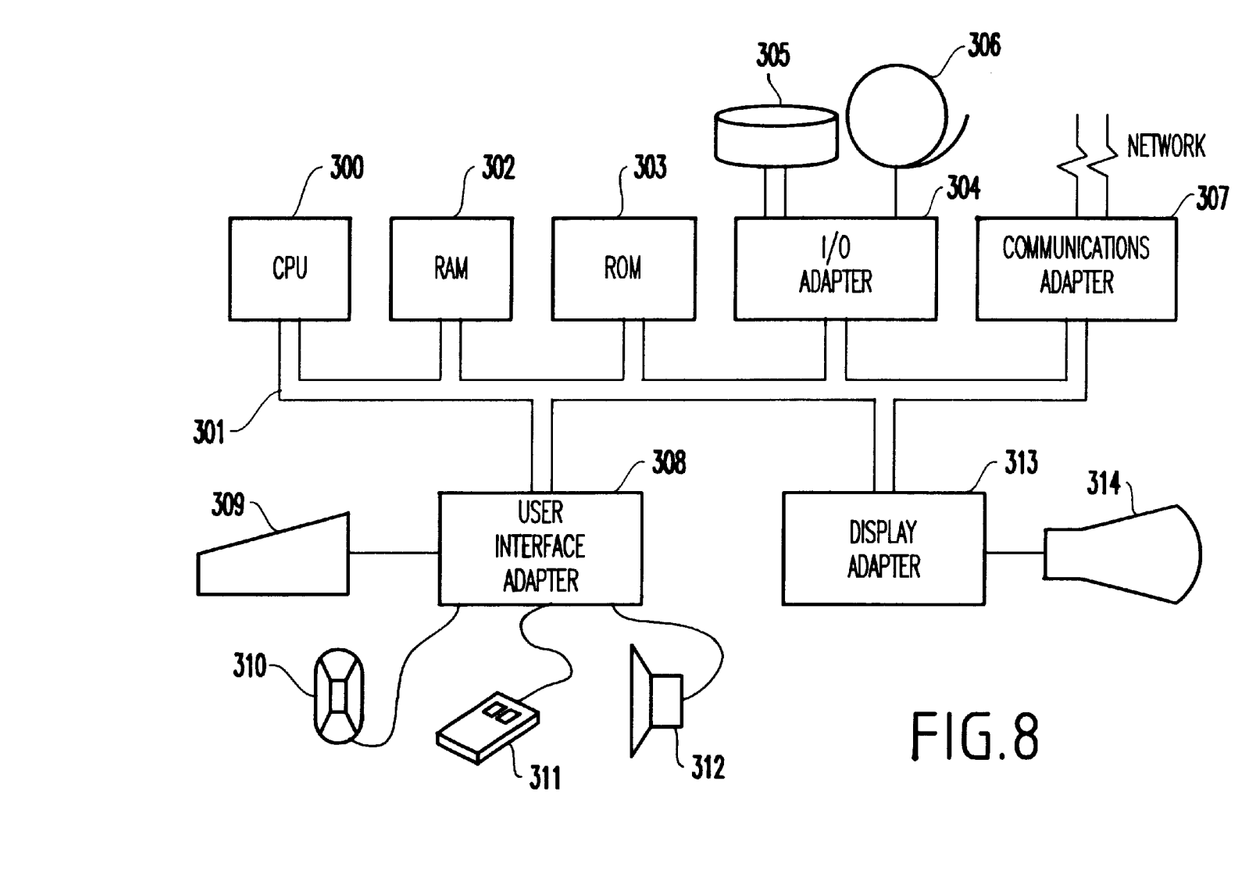
FIG. 8 is a typical hardware configuration of an information handling/computer system in accordance with the present invention.

FIG. 8 illustrates a typical hardware configuration of an information handling/computer system for operating the invention. Such a system preferably has at least one processor or central processing unit (CPU) 300. The CPU 300 is interconnected via a system bus 301 to a random access memory (RAM) 302, read-only memory (ROM) 303, input/output (I/O) adapter 304 (for connecting peripheral devices such as disk units 305 and tape drives 306 to the bus 301), communication adapter 307 (for connecting an information handling system to a data processing network), user interface adapter 308 (for connecting a keyboard 309, microphone 310, mouse 311, speaker 312 and/or other user interface device to the bus 301), and display adapter 313 (for connecting the bus 301 to a display device 314). The CPU 300 is preferably capable of performing the above described method of partitioning and solving the matrix equation. The CPU 300 may be further connected to communicate with additional workstations or processors such as processors 50, 52 and 54 to perform the tasks described above including the relaxation method.

The above described method thereby solves the matrix equation by partitioning the IC into several segments. This allows each processor to separately solve the matrix equation (1) and thereby make the IC design automation more efficient.

The amount of data to describe a contemporary microprocessor is so large (i.e., on the order of three gigabytes) that it is impossible to run a simulation in a single workstation. The stitch and seam method disclosed above enables any microprocessor design to scale to any number of workstations. This method may be used to solve simulations from other disciplines (i.e., weather) as long as step S66 in FIG. 5 is updated to reflect the type of system being solved.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of designing an integrated circuit, the method comprising:

receiving a graphical description of said integrated circuit;

extracting shapes relating to a specific circuit function from said graphical description of said integrated circuit;

partitioning said extracted shapes into a plurality of segments;

forming an electrical representation of said integrated circuit for each of said plurality of segments;

solving a matrix equation for each of said plurality of segments based on said electrical representation, wherein said matrix equation is solved to determine voltages at specific locations of said integrated circuit;

exchanging voltages between adjacent segments; and iteratively repeating said solving said matrix equation, using exchanged voltages, until said respective voltages are within a predetermined tolerance.

2. The method of claim 1, wherein said matrix equation is $Gv=i$, where G relates to resistance, i relates to current and v relates to voltage.

3. The method of claim 2, wherein said partitioning comprises locating seams within said extracted shapes, each seam crossing a mesh line defined by said extracted shapes of said integrated circuit.

4. The method of claim 3, wherein said partitioning further comprises creating stitches within said extracted shapes and identifying stitch nodes at areas where seams cross mesh lines.

5. The method of claim 4, wherein solving said matrix equation for each of said plurality of segments comprises determining a voltage at each stitch node.

6. The method of claim 4, wherein said electrical representation comprises a plurality of resistors that connect at each stitch node.

7. The method of claim 4, wherein each matrix equation is solved by:

forming a matrix representation of each segment based on said electrical representation for that respective segment; and determining a voltage at each stitch node for each respective segment.

8. The method of claim 7, further comprising:

exchanging the determined stitch node voltages between adjacent segments;

computing a new current for each segment;

determining a new voltage at each stitch node for each respective segment using said new current; and determining whether said new voltage at each stitch node is within a predetermined tolerance.

9. The method of claim 1, wherein said specific circuit function relates to power.

10. The method of claim 1, wherein said electrical representation comprises a netlist.

11. A method of designing an integrated circuit, the method comprising:

receiving a geographical representation of said integrated circuit;

identifying shapes related to a specific function of said integrated circuit;

defining seams within said geographical representation, said seams partitioning said integrated circuit into a plurality of segments;

obtaining an electrical representation for each of said segments;

separately and independently solving a matrix equation for each of said plurality of segments based on said electrical representation, wherein said matrix equation is solved to determine voltages at specific locations of said integrated circuit;

exchanging voltages between adjacent segments; and iteratively repeating said solving said matrix equation for each of said plurality of segments, using exchanged voltages, until said respective voltages are within a predetermined tolerance.

12. The method of claim 11, wherein said matrix equation for each of said plurality of segments is $Gv=i$, where G relates to resistance, i relates to current and v relates to voltage.

13. The method of claim 11, further comprising creating stitch nodes along each of said seams.

14. The method of claim 13, wherein solving said matrix equation for each of said plurality of segments comprises determining a voltage at each stitch node.

15. The method of claim 13, wherein said electrical representation comprises a plurality of resistors that connect at each stitch node.

16. The method of claim 13, wherein each matrix equation is solved by:

forming a matrix representation of each segment based on said electrical representation for that respective segment; and determining a voltage at each stitch node for each respective segment.

17. The method of claim 11, further comprising:

exchanging the determined stitch node voltages between adjacent segments;

computing a new current for each segment;

determining a new voltage at each stitch node for each respective segment using said new current; and determining whether said new voltage at each stitch node is within a predetermined tolerance.

18. A method of designing an integrated circuit, the method comprising:

receiving an electrical representation of said integrated circuit, said electrical representation including a plurality of segments, each segment being partitioned by a seam;

solving a matrix equation for each of said plurality of segments based on said electrical representation to determine stitch node voltages;

exchanging stitch node voltages among said plurality of segments;

computing a new current for each segment using said exchanged stitch node voltages;

resolving said matrix equation for each of said plurality of segments using said new current for each segment so as to determine new stitch node voltages;

determining whether said new stitch node voltages are within a predetermined tolerance; and reiterating said exchanging said stitch node voltages, said computing of said new current and said resolving of said matrix equation until said new stitch node voltages are within said predetermined tolerance.

19. The method of claim 18, wherein said matrix equation is Gv=i, where G relates to resistance, i relates to current and v relates to voltage.

20. A program storage device readable by machine, tangibly embodying a program of instructions executable by the machine to perform a method comprising:

receiving a graphical description of said integrated circuit;

extracting shapes relating to a specific circuit function from said graphical description of said integrated circuit;

partitioning said extracted shapes into a plurality of segments;

forming an electrical representation of said integrated circuit for each of said plurality of segments;

solving a matrix equation for each of said plurality of segments based on said electrical representation, wherein said matrix equation is solved to determine voltages at specific locations of said integrated circuit;

exchanging voltages between adjacent segments; and iteratively repeating said solving said matrix equation, using exchanged voltages, until said respective voltages are within a predetermined tolerance.

21. The program storage device of claim 20, wherein said matrix equation is Gv=i, where G relates to resistance, i relates to current and v relates to voltage.

22. The program storage device of claim 21, wherein said partitioning comprises locating seams within said extracted shapes, each seam crossing a mesh line defined by said extracted shapes of said integrated circuit.

23. The program storage device of claim 22, wherein said partitioning further comprises creating stitches within said extracted shapes and identifying stitch nodes at areas where seams cross mesh lines.

24. The program storage device of claim 23, wherein solving said matrix equation for each of said plurality of segments comprises determining a voltage at each stitch node.

25. The program storage device of claim 23, wherein said electrical representation comprises a plurality of resistors that connect at each stitch node.

26. The program storage device of claim 23, wherein each matrix equation is solved by:

forming a matrix representation of each segment based on said electrical representation for that respective segment; and determining a voltage at each stitch node for each respective segment.

27. The program storage device of claim 26, the method further comprising:

exchanging the determined stitch node voltages between adjacent segments;

computing a new current for each segment;

determining a new voltage at each stitch node for each respective segment using said new current; and determining whether said new voltage at each stitch node is within a predetermined tolerance.

28. The program storage device of claim 20, wherein said specific circuit function relates to power.

29. The program storage device of claim 20, wherein said electrical representation comprises a netlist.

* * * * *